United States Patent
Goulakov (10) Patent No.: US 7,579,252 B2
(45) Date of Patent: Aug. 25, 2009

(54) SELF ALIGNED PROCESS FOR BJT FABRICATION

(75) Inventor: Arkadi Goulakov, Longmont, CO (US)

(73) Assignee: Microsemi Corporation, Bend, OR (US)

( * ) Notice: Subject to any disclaimer, the term of this patent is extended or adjusted under 35 U.S.C. 154(b) by 177 days.

(21) Appl. No.: 11/536,581

(22) Filed: Sep. 28, 2006

(65) Prior Publication Data

US 2007/0075334 A1    Apr. 5, 2007

Related U.S. Application Data

(60) Provisional application No. 60/722,387, filed on Sep. 30, 2005, provisional application No. 60/803,596, filed on May 31, 2006.

(51) Int. Cl.
*H01L 21/331* (2006.01)
*H01L 29/70* (2006.01)

(52) U.S. Cl. .................. 438/343; 257/586

(58) Field of Classification Search ......... 438/342–345, 438/197–208; 257/586, 197, 563
See application file for complete search history.

(56) References Cited

U.S. PATENT DOCUMENTS

| 4,430,792 A | 2/1984 | Temple |
| 5,569,944 A * | 10/1996 | Delaney et al. ............. 257/198 |
| 6,764,907 B2 * | 7/2004 | Van Zeghbroeck et al. .. 438/270 |
| 2005/0269594 A1 * | 12/2005 | Chen et al. .................. 257/183 |

FOREIGN PATENT DOCUMENTS

JP   07-297204 A   10/1995

* cited by examiner

*Primary Examiner*—Calvin Lee
(74) *Attorney, Agent, or Firm*—Marger Johnson & McCollom, P.C.

(57) ABSTRACT

Methods for forming a SiC BJT having a low base resistance and minimal emitter width are provided. The methods incorporate a plated shadow metal layer overhanging the emitter mesa. The mushroom-shaped shadow metal layer can then act as either a deposition shadow mask or an ion implantation mask in subsequent steps for forming base contacts. In this way, base contacts can be formed with a variable and controllable distance from the emitter mesa defined by the lateral extent of overhang of the shadow metal layer. The same shadow masking effect can also be used to form self-aligned emitter and base wiring metals for reduction of resistance. Plating of the emitter contact layer allows avoiding subsequent photolithography steps on the top of emitter mesa; thus emitter mesa width could be minimized.

43 Claims, 6 Drawing Sheets

*1.76 microns*

FIG. 15

*0.5 microns*

FIG. 16

SELF ALIGNED PROCESS FOR BJT FABRICATION

CROSS-REFERENCE TO RELATED APPLICATIONS

This application claims the benefit of U.S. Provisional Patent Application No. 60/722,387, filed on 30 Sep. 2005, and U.S. Provisional Patent Application No. 60/803,596, filed on 31 May 2006, the disclosures of which are hereby incorporated herein by reference in their entirety.

STATEMENT REGARDING FEDERALLY SPONSORED RESEARCH OR DEVELOPMENT

This invention was made with Government support under Contract No. 70NANB3H3016 awarded by the National Institute for Standards and Technology (NIST). The Government has certain rights in the invention.

BACKGROUND OF THE INVENTION

1. Technical Field

This disclosure relates to methods of fabricating silicon carbide (SiC) bi-polar junction transistors (BJT). Specifically, the disclosure relates to methods of forming self-aligned base and/or emitter contacts in SiC BJTs.

2. Description of the Related Art

Recent achievements in wide band-gap semiconductor technology have made SiC BJTs a primary candidate for high power and/or high frequency applications. However, one of the factors limiting the high frequency performance of SiC BJTs is the base resistance. One method to reduce the base resistance is to make the base contacts closer to the emitter mesa. Conventional methods for reducing the distance between the base contacts and the emitter mesa as well as minimizing emitter mesa width involve complicated and time-consuming processing steps such as electron beam lithography. This disclosure addresses this and other disadvantages of the conventional methods for forming high power/high frequency SiC BJTs.

SUMMARY OF THE INVENTION

The invention is directed to methods of fabricating BJTs with self-aligned base and/or emitter contacts. The formation by plating of a mushroom-shaped shadow metal layer enables the base contacts to be formed in close proximity to and in electrical isolation from the emitter mesa. Fabrication of contacts by plating allows minimizing emitter mesa width by avoiding stringent photolithography alignment steps on the top of emitter mesa.

The methods and structures disclosed herein are also applicable to other semiconductor devices.

The foregoing and other features and advantages of the disclosure will become more apparent by describing in detail exemplary embodiments thereof with reference to the following drawings.

DETAILED DESCRIPTION

Example embodiments of the invention are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity.

It will be understood that when an element or layer is referred to as being "on," "over," "connected to," or "coupled to" another element or layer, it can be directly on, connected or coupled to the other element or layer or intervening elements or layers may be present. In contrast, when an element is referred to as being "directly on," "directly connected to," "contacting," or "directly coupled to" another element or layer, there are no intervening elements or layers present. Like numbers refer to like elements throughout. Spatially relative terms, such as "beneath," "below," "lower," "above," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that are known to result, for example, from normal manufacturing. For example, an implanted region illustrated as a rectangle will, typically, have rounded or curved features and/or a gradient of implant concentration at its edges rather than a binary or step change from implanted to non-implanted region. Likewise, a buried region formed by implantation may result in some implantation in the region between the buried region and the surface through which the implantation takes place. Thus, the regions illustrated in the figures are schematic in nature and their shapes are not intended to be restrictive on the actual shape of a region of a device and are not intended to limit the scope of the disclosure.

FIGS. 1 through 4 are cross-sectional views illustrating a method of forming a shadow metal layer according to an embodiment of the invention.

Figure 1:
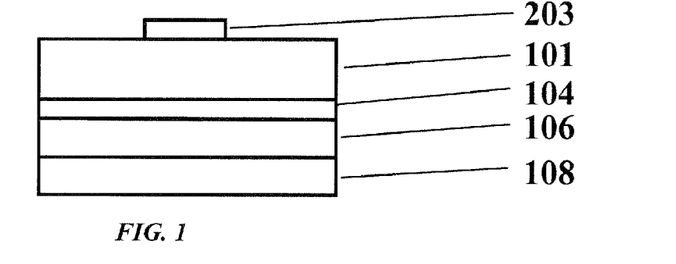
FIGS. 1 through 4 are cross-sectional views illustrating a method of forming a shadow metal layer according to an embodiment of the invention.

Referring to FIG. 1, a method for forming a SiC BJT includes epitaxially growing an n-type collector layer 106, a p-type base layer 104, and an n-type emitter layer 101 on an n-type 4H—SiC substrate 108. A layer of metal, such as nickel or an alloy of nickel, or other materials or composite of layers of material with the characteristic of the top layer having substantial resistance to etching of layer 101, may then be deposited on the emitter layer 101 and patterned by a lift-off process or other technique such as etching to form a mask layer 203. It is most desirable to form the mask layer 203 as a composite layer such that the top portion of the composite layer is mesa etch resistant and the bottom layer forms good ohmic contact to the emitter mesa with the top layer easily removable without attacking the bottom layer. For example, layer 203 could be formed in a composite layer such as nickel on tungsten, or another metal with a different etching characteristics than nickel on nickel-chromium, nickel on polysilicon on nickel-chromium, nickel on oxide on nickel-chromium, nickel on sputtered silicide on nickel-chromium, and other appropriate combinations which allows the formation of plated metal layer 206 on top of mask layer 203 to selectively protect the mesa from attack in the ensuing etch and to keep the bottom layer in the composite from being contaminated in the etch. Following the creation of mesa 102, the plated layer 206 and a part of mask layer 203 may be removed to expose the clean protected part of mask layer 203 which can be used to form good ohmic contact to mesa 102 and to receive wiring metal to its top surface in a self-aligned process. A lift-off process typically involves formation of a photoresist pattern on a substrate. The photoresist is removed in areas where metal deposition is desired, thereby exposing the substrate. The metal is then deposited over the entire substrate, covering the photoresist pattern and the exposed areas. The remaining photoresist is then removed, typically using a solvent such as acetone, causing the metal on top of the photoresist to be removed and the metal attached to the exposed areas to remain. The metal may be deposited by processes known in the art, such as vacuum evaporation or sputter deposition.

Figure 2:
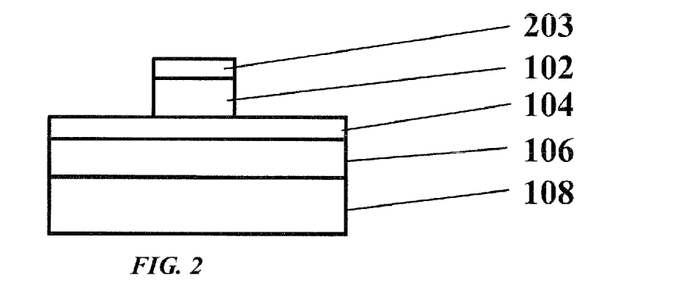

Referring to FIG. 2, the emitter layer 101 is anisotropically etched, thereby forming the emitter mesa 102. The mask layer 203 acts as an etch protection mask for the anisotropic etching. The base layer 104 may act as an etch stop layer, thereby ensuring that all of the emitter layer 101 is removed from the base layer 104 outside of the emitter mesa 102. The anisotropic etch may include a reactive ion etch (RIE) process. The etch depth, and the resulting emitter mesa 102 thickness may be, for example, about 300 nm.

Figure 3:
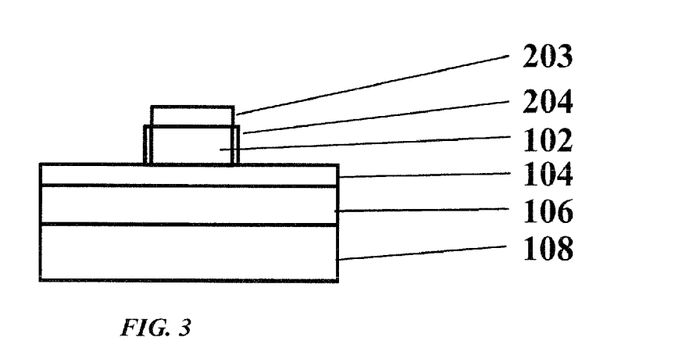

Referring to FIG. 3, an oxide is deposited over the surface of the base layer 104, the sidewalls of the emitter mesa 102, and the mask layer 203. The deposited material is then anisotropically etched to form an oxide sidewall 204 on the sidewalls of the emitter mesa 102. The anisotropic etch may include an RIE process with process parameters such as 20 mTorr of pressure, 100 W of power, and a $CF_4$ or other fluorine or chlorine bearing source gas. The pressure and power employed are specific to the type of etch tool used. Other process parameters are possible and known to those skilled in the art. The oxide sidewall 204 may have a thickness of about 20-50 nm. The oxide sidewall 204 may be partially extended onto the sidewalls of the mask layer 203. A material other than an oxide may be used to form sidewall spacers, as is known to persons skilled in the art. The main function of sidewall oxide 204 is to provide electrical isolation and to prevent the formation of electrical shorts between emitter mesa 102 and base contact 208. The formation of oxide sidewall 204 could be omitted if lateral protrusion overhanging is sufficient to insure electrical isolation between emitter mesa 102 and deposited base contact layer 208. In the event the sidewall spacer is not an insulator, it will need to be removed at some later step in the process.

Figure 4:
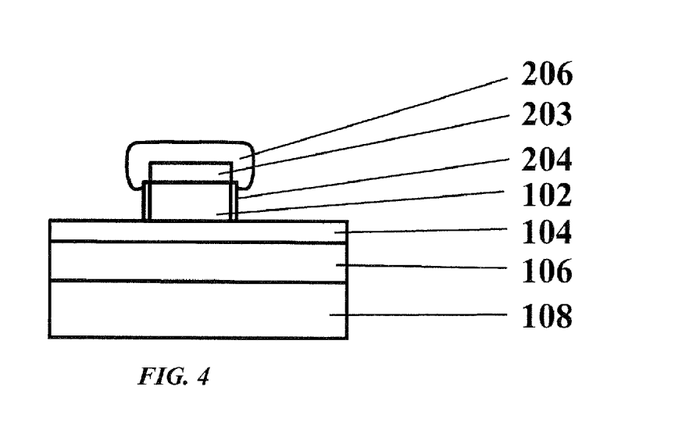

Referring to FIG. 4, a shadow metal layer 206 is formed by plating metal on the mask layer 203 and on its sidewalls. The shadow metal layer 206 may contain nickel, chromium, gold, or other plated metal. The shadow metal layer 206 may have a thickness of about 150 nm and has a mushroom shape with lateral protrusions overhanging the sidewalls of the emitter mesa 102 and the oxide sidewall 204. The shadow metal layer 206 may be formed by an electroless or electroplating process and the thickness and the extent of lateral overhang may be accurately controlled by adjusting the process conditions such as temperature as well as the process time and/or the applied current during the electroplating process. In the case of electroplating, the emitters can be connected together by a plating bus which will require an additional mask.

Figure 5:
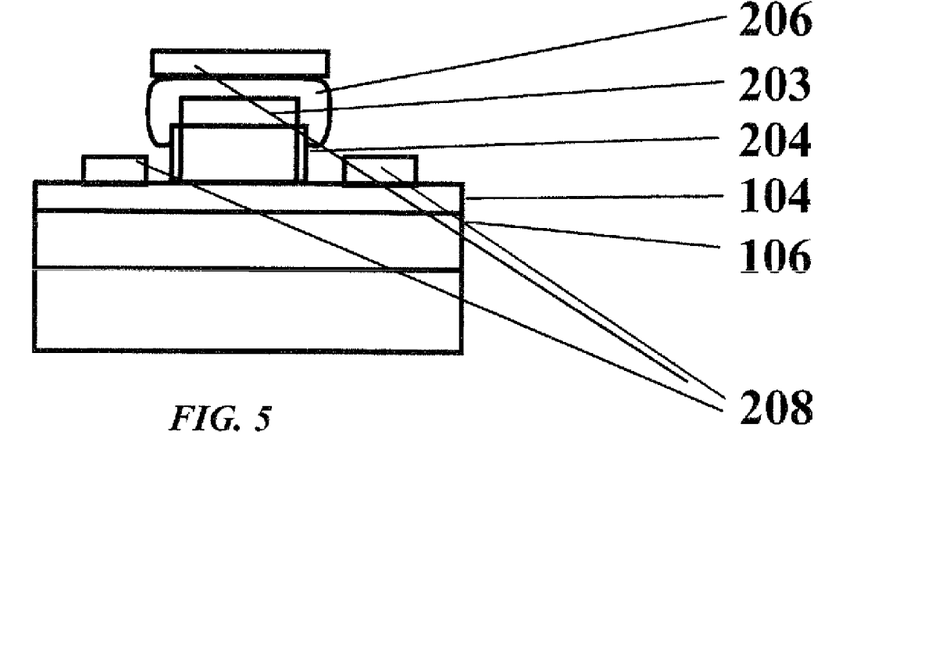
FIGS. 5 through 7 are cross-sectional views illustrating a method of forming self-aligned base contacts for BJT fabrication by shadow directional metal deposition using the shadow metal layer of FIG. 4.
Figure 6:
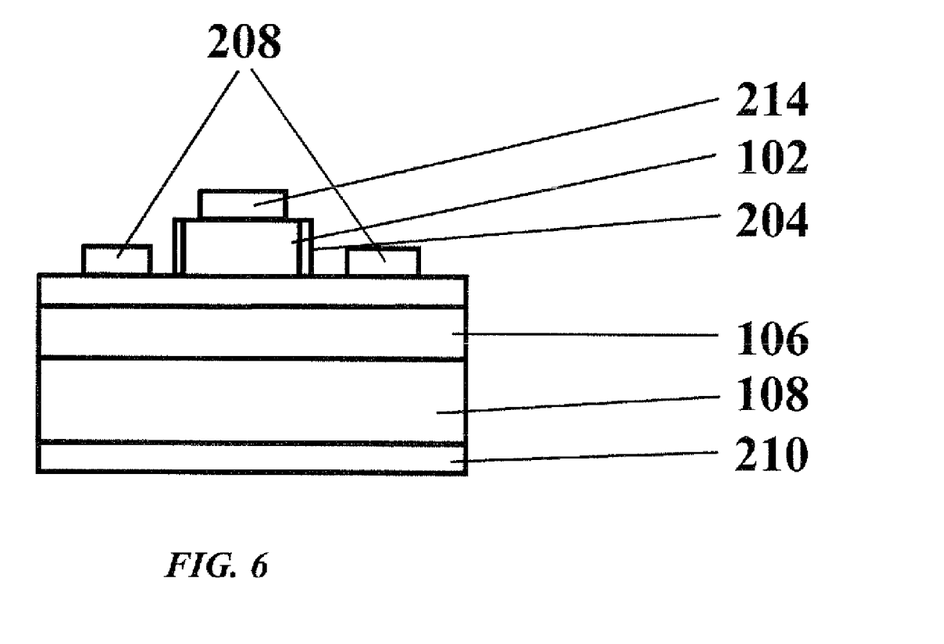
Figure 7:
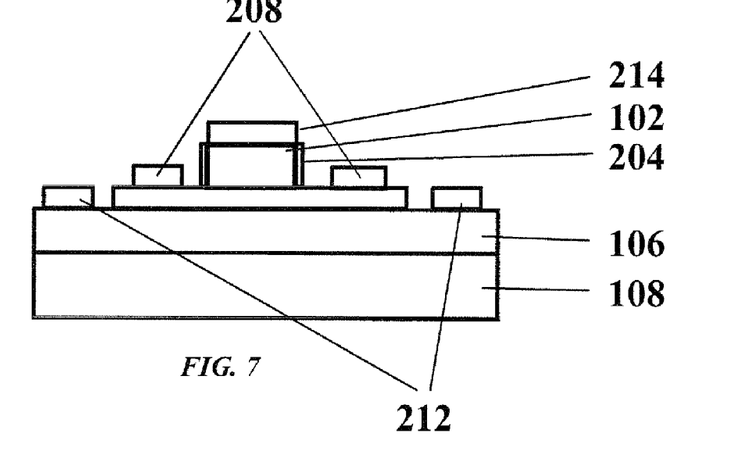

FIGS. 5 through 7 are cross-sectional views illustrating a method of forming a self-aligned base contact by a directional deposition process such as metal evaporation or sputtering using the shadow metal layer of FIG. 4.

Referring to FIG. 5, base contacts 208 are formed on the base layer by a directional metal deposition process. During the directional metal deposition process, plated metal layer 206 acts as a shadow mask, preventing deposition of metal under the overhang. A lift-off process or a photolithography and etching process may be used to pattern outer edges of the base contacts 208. The base contacts 208 may comprise 16 nm of titanium and 40 nm of aluminum sequentially stacked. Other contact metals and other thickness combinations known to persons skilled in the art may be used.

At this point, shadow metal layer 206 and mask layer 203 may be selectively removed, exposing the top of the emitter mesa 102. The base contacts 208 may be annealed using a rapid thermal annealing (RTA) process at a temperature of about 950° C. to about 1000° C. Optional removal of shadow metal layer 206 and/or sidewall oxide layer 204 has an advantage of removing metal filaments between emitter mesa 102 and base contact 208 formed during deposition of base metal 208. The exposed sidewall of 102 can be further strengthened by an insulative passivation layer on the surface to eliminate low level current conduction along the surface when distance between base contact and emitter mesa shrinks.

Referring to FIG. 6, an emitter contact 214 may be formed on the emitter mesa 102 if the shadow metal layer 206 and the mask layer 203 were removed in the previous step. The emitter contact 214 may be formed by sequentially depositing nickel and chromium and then performing a lift-off. Another alternative method to form emitter contact is the self aligned plating process described below and illustrated by FIG. 13. Alternatively, the shadow metal layer 206 and the mask layer 203, or a portion of layer 203 in the case of a composite of layers, may be used as an emitter contact 214 if they provide a low contact resistance to the emitter mesa 102 and they can withstand the high temperatures of subsequent RTA processes without significant deformation or evaporation. In this case, the emitter contact 214 will be self-aligned to the emitter mesa 102 because mask layer 203 was used as an etch mask to form the emitter mesa and retained to form the emitter contact.

Figure 11:
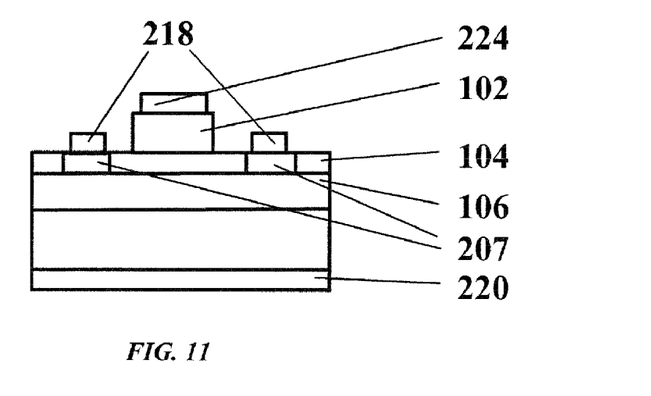

Referring to FIG. 7, collector contacts 212 are formed. The collector contacts 212 may be formed on the backside of the substrate 108 as shown in FIG. 11. Alternatively, the collector contacts 212 may be formed on the front side of the collector layer 106. In this case, an upper surface of the collector layer 106 must first be exposed using an RIE process to remove a portion of base layer 104. The collector contacts 212 may be formed by sequentially depositing nickel and chromium and then performing a patterning step such as by photolithography and etching or by a lift-off process. The emitter contact 214 and the collector contacts 212 may be annealed using an RTA process at a temperature of about 950° C. to about 1000° C. The base contacts 208 may also be annealed at this step if they were not annealed in an earlier step. Completion of the BJT structure may include mesa isolation, dielectric deposition, via-hole etching, and deposition of wiring metal patterns according to conventional processes.

FIGS. 8 through 12 are cross-sectional views illustrating a method of forming a self-aligned BJT with shadow ion implantation using the shadow metal layer of FIG. 4.

Figure 8:
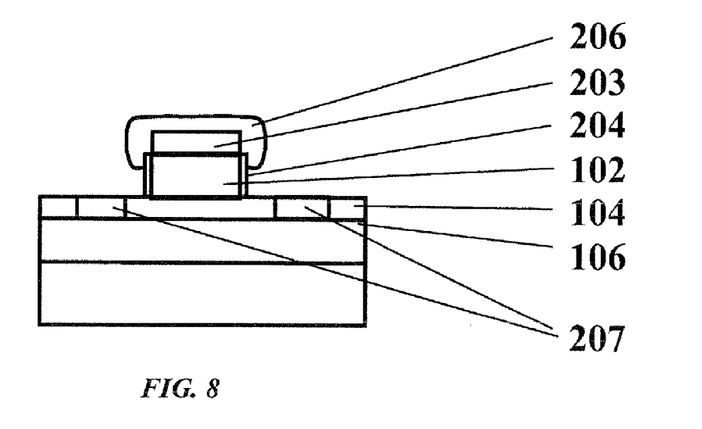
FIGS. 8 through 12 are cross-sectional views illustrating a method of forming self-aligned base contacts for BJT fabrication with shadow ion implantation using the shadow metal layer of FIG. 4.

Referring to FIG. 8, a method for fabricating a self-aligned BJT by shadow ion implantation includes the steps associated with FIGS. 1 through 4 described above. Then, highly-doped regions 207 are formed in the base layer 104. The highly-doped regions 207 may be formed by ion implantation of aluminum ions or other dopant using the shadow metal layer 206 as an implantation mask. An edge of the highly-doped regions 207 may be laterally spaced from an adjacent one of the emitter mesa sidewalls by a distance defined by a lateral extent of overlap of the shadow metal layer 206 and the sidewall spacer thickness if a sidewall spacer is used. It is also possible to form a layer of metal or insulator of precise thickness over the top surface of the structure in FIG. 8 before the ion implantation step and to use the layer thickness and implantation energy to regulate the depth of implanted impurity into base layer 104. For example, it is possible to combine the implantation energy of aluminum atoms and a sequentially deposited aluminum layer over titanium metal layer of a desired thickness to place the implanted aluminum of a high dose at the very top surface of 104 and use the deposited aluminum-titanium to form the ohmic contact to layer 104. Improved ohmic contact can be achieved well below the normal activation energy between 1500-1600° C.

Figure 9:
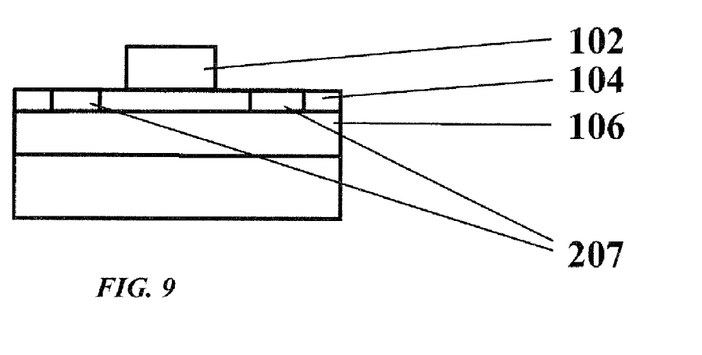

Referring to FIG. 9, shadow metal layer 206 and mask layer 203 are removed, thereby exposing the top of the emitter mesa 102. The sidewall oxide 204 may also be removed. The sidewall oxide 204 may be removed by a wet etch process including buffered oxide etch (BOE). If materials other than oxide is used for the spacer, the spacer can be removed after the formation of the self-aligned base contact using an appropriate etching method known to those skilled in the art without eroding the base metal. Next, an implant anneal process is performed. The implant anneal may be performed at a temperature of about 1500° C. to about 1600° C. According to some embodiments, the sidewall oxide 204 is not removed. In this case, the sidewall 204 must be formed from a material capable of withstanding the high temperatures associated with the implant anneal process.

Figure 10:
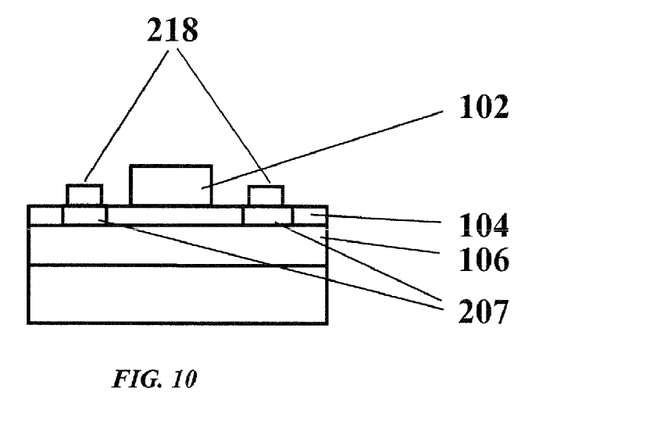

Referring to FIG. 10, base contacts 218 are formed on the highly-doped regions 207 in the base layer 104. A lift-off or etching process may be used to pattern the base contacts 218. The base contacts 218 may comprise 16 nm of titanium and 40 nm of aluminum, sequentially stacked. The base contacts 218 may be annealed using an RTA process at a temperature of about 950° C. to about 1000° C. Referring to FIG. 11, an emitter contact 224 may be formed on the emitter mesa 102. The emitter contact 224 may be formed by sequentially depositing nickel and chromium in conjunction with performing a lift-off or etching process. Next, collector contacts 220 may be formed on the backside of the substrate 108. The collector contacts 220 may be formed by sequentially depositing nickel and chromium on the backside of the substrate 108.

Figure 12:
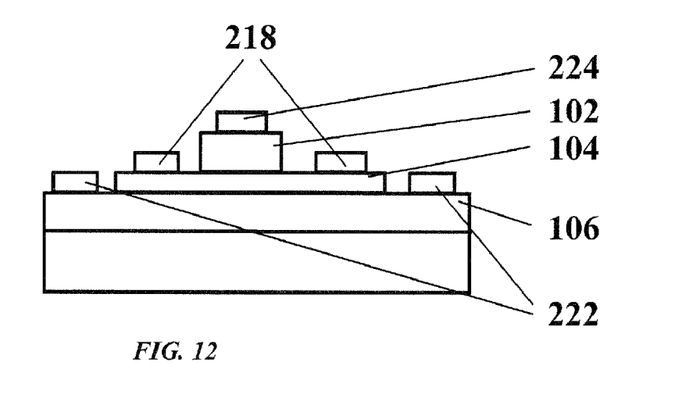

Referring to FIG. 12, the collector contacts 222 may be formed on the front side of collector layer 106 instead of the backside of the substrate 108. In this case, an upper surface of the collector layer 106 must first be exposed using an RIE process to remove base layer 104. The emitter contact 224 and the collector contacts, 220 or 222, may be annealed using an RTA process at a temperature of about 950° C. to about 1000° C. The base contacts 218 may also be annealed at this step if they were not annealed in an earlier step. Completion of the BJT structure may include mesa isolation, dielectric deposition, via-hole etching, and deposition of wiring metal patterns according to conventional processes.

Figure 13:
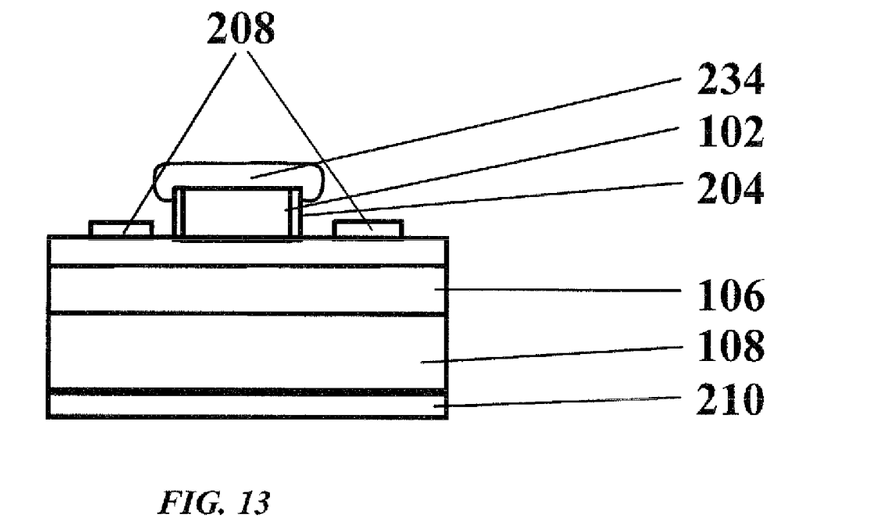
FIGS. 13 through 14 are cross-sectional views illustrating a method of forming self-aligned emitter contact and wiring metal for BJT fabrication by shadow metal evaporation using the shadow emitter contact layer.
Figure 14:
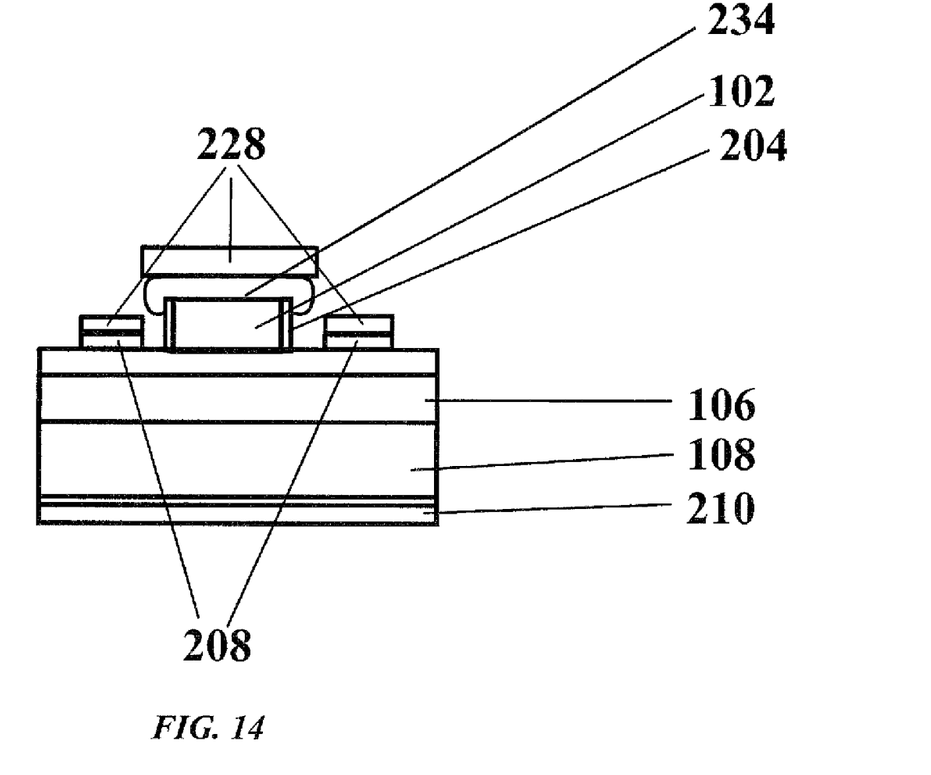

FIGS. 13 and 14 are cross-sectional views illustrating a method of forming a self-aligned emitter contact and wiring metal after self aligned base contact layer was fabricated. The self-aligned emitter metal 234 can come from layer 203 and 206 or replated on remnants of layer 203. The formation method includes plating process and shadow metal evaporation or sputtering. Wiring metal is used to reduce resistance to emitter and base contacts and to increase electrical current capability of fabricated transistors. The emitter contact 234 may also be formed on the emitter mesa 102 directly without a plating enhancement layer.

The emitter contact 234 may be formed by performing a plating process. Metal deposition by plating is self aligned and does not require photolithography alignment thus allowing minimizing the emitter width. Deposited by plating, the emitter contact will have a mushroom shape with lateral protrusions overhanging the sidewalls of the emitter mesa 102 and the oxide sidewall 204. The emitter contact metal layer 234 may be formed by an electroless or electroplating process and the thickness and the extent of lateral overhang may be accurately controlled by adjusting the process time and/or the applied current during the electroplating process. In the case of electroplating, the emitters can be connected together by a plating bus which will require an additional mask. The deposition of emitter contacts by plating may require an additional step of annealing at a temperature of about 950° C. to about 1000° C. if it is not created before the anneal step associated with base metal 208. Referring to FIG. 14, wiring metal 228 are formed on the base contact layer 208 and on the emitter contact layer 234 by a directional metal deposition process such as evaporation or sputtering. During directional metal deposition process, the emitter contact layer 234 acts as a shadow mask, preventing deposition of metal under the overhang. A lift-off or etching process may be used to pattern outer edges of the wiring metal 228. The wiring metal 228 may comprise 10 nm of titanium and 300 nm of gold, sequentially stacked. Other contact metals and other thickness combinations known to persons skilled in the art may be used.

Figure 15:
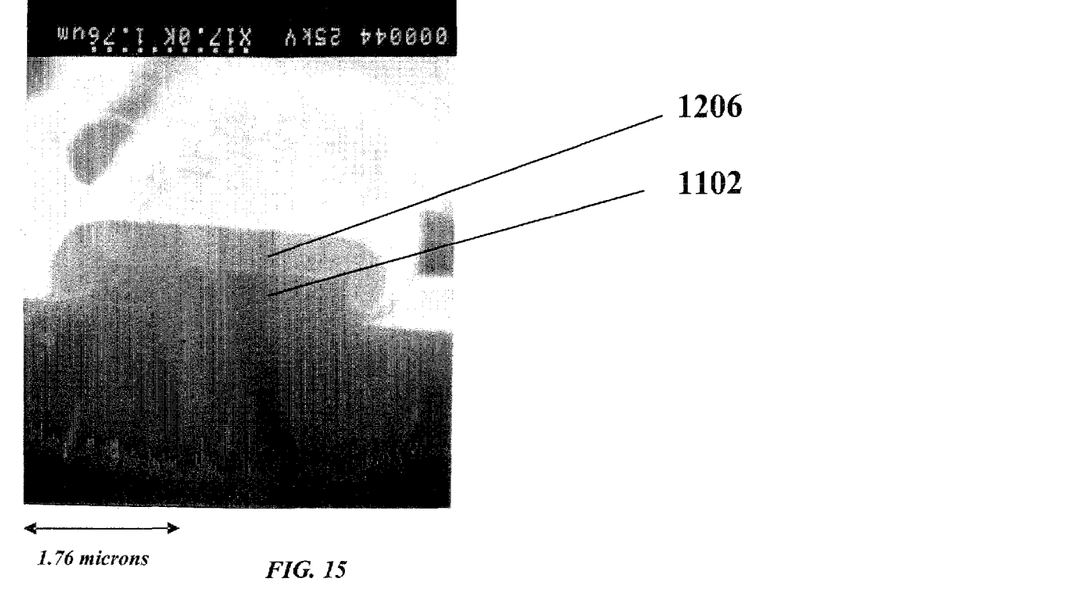
FIG. 15 is a scanning electron microscope (SEM) image of a shadow metal layer according to an embodiment of the invention.
Figure 16:
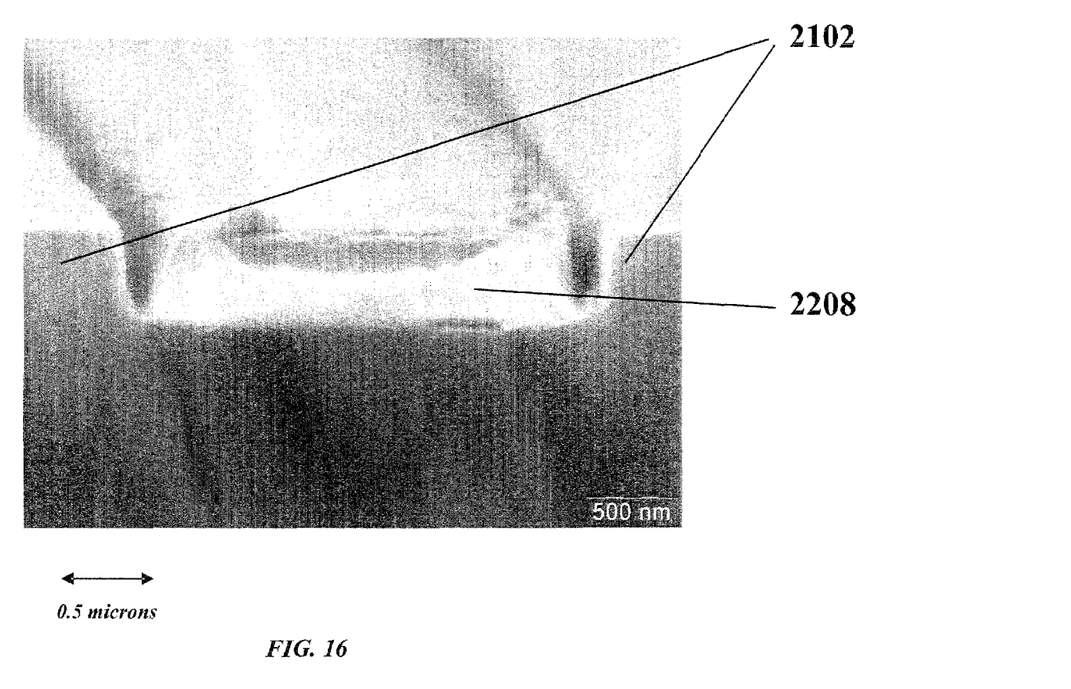
FIG. 16 is a scanning electron microscope (SEM) image of a deposited contact metal layer after removal of a shadow metal layer according to an embodiment of the invention.

FIGS. 15 and 16 illustrate successful demonstration of key processing steps thus proving the feasibility of the whole process.

Referring to FIG. 15, the SEM image is a cross section of the sample number 1 which was processed to the step presented on FIG. 4. The image shows shadow metal layer 1206 on top of an etched mesa 1102 fabricated in accordance with an embodiment of the invention. The RIE etched mesa layer 1102 is a geometrical analog of the emitter mesa layer 102 with a height of about 400 nm. The Ni layer 1206 deposited by plating is a realization of the shadow metal layer 206 with a thickness and lateral protrusions overhung of about 300 nm. In the image, the lateral growth of the shadow metal layer is clearly shown and its thickness is roughly equal to the vertical height of the shadow metal layer. The lateral growth of the shadow metal layer determines the distance between the base contacts and the emitter mesa after shadow directional metal deposition. Creating the thinnest controllable lateral growth of 206 to enable making self-aligned base and emitter metal contacts 208 and 224 (234) without base-emitter shorts produces the highest frequency device.

Referring to FIG. 16, the SEM image is a cross section of the sample number 2, which was processed up to the step presented on FIG. 6. The image shows deposited contact metal layer 2208 after removal of a shadow metal layer fabricated in accordance with an embodiment of the invention. The RIE etched mesa layer 2102 is a geometrical analog of the emitter mesa layer 102 with the height of about 400 nm. An evaporation deposition of the metal layer 2208 was done with the shadow metal mask on the top of the etched mesa 2102. After the deposition of the metal layer 2208, the shadow metal mask was removed by a selective etching. The metal layer 2208 is an analog of the base contact layer 208. In the image, the distance between the base contacts and the emitter mesa is about 150 nm which is defined by a lateral extent of overhang of the shadow metal layer fabricated on the sample number 2. In practice, it is much better to leave the sidewall insulator in place to prevent any surface leakage current from base to emitter. This can be accomplished by tailoring the plated overhang and shadow deposition to ensure no filamentary base-emitter shorts occur.

A SiC BJT fabricated in accordance with the methods described above will have a minimum distance between the base contacts and the emitter mesa as well as minimum emitter mesa width. Further, the extent of that distance can be precisely controlled by varying the process parameters while forming the shadow metal layer. In this way, the base resistance of the BJT device can be minimized, and the high frequency operation of the device can be improved, without complicated and time-consuming processing steps.

The foregoing description is illustrative of the principles of the invention and is not to be construed as limiting of the disclosure. Although a few example embodiments have been described, those skilled in the art will readily appreciate that many modifications are possible in the example embodiments without materially departing from the novel teachings and advantages of the disclosure. For example, although the illustrated embodiments show an NPN BJT, the principles of the invention apply equally to a PNP BJT or other electronic devices which can benefit from achieving electrical isolation between two closely spaced electrodes of differing potential. One such example is found in the SIT (Static Induction Transistor) device whose gate and cathode are in close proximity to one another. The invention is also applicable to a MESFET (Metal Semiconductor Field Effect Transistor) with closely spaced gate and source/drain electrodes. The examples are given in a SiC BJT. However to one skilled in the art, the principle disclosed applies equally well to GaN on SiC and other material combinations. The substrate is a doped semiconductor in the BJT example herein, but could include an insulative or semi-insulative substrate for other devices. Example annealing temperature ranges are given for the contact metals used in the described embodiments of SiC BJTs; other temperature ranges (e.g., 900° C. to 1100° C.) can be used for different combinations of metals and semiconductor materials and devices. Accordingly, all such modifications are intended to be included within the scope of the disclosure as defined in the claims.

The invention claimed is:

1. A method of forming a bi-polar junction transistor (BJT), the method comprising:
    forming a mask layer including metal on an emitter layer of a semiconductor substrate;
    etching the emitter layer to expose a base layer of the semiconductor substrate, thereby forming an emitter mesa;
    forming insulative sidewall spacers on the sidewalls of the emitter mesa;
    electroplating a shadow metal layer on a top surface and opposite side surfaces of the mask layer, laterally overlapping the mesa sidewalls and sidewall spacers; and
    forming by directional metal deposition a base contact on the base layer using the lateral overlap of the plated shadow metal layer to define an edge of the base contact.

2. A method according to claim 1 further comprising forming a wiring metal layer over the base and the emitter contact metals in a self-aligned deposition to effect electrical separation of base and emitter metals utilizing shadowing of the mushroom shape of the plated emitter contact metal.

3. The method of claim 1, further comprising:
    annealing the base contact;
    forming an emitter contact;
    forming a collector contact; and
    annealing the emitter contact and the collector contact.

4. The method of claim 1, wherein forming a base contact comprises:
    depositing a base contact metal on a base layer, using the shadow metal layer as a deposition shadow mask,
    the base contact metal being electrically separate from the emitter metal due to a lateral extent of overhang of the shadow metal layer.

5. The method of claim 4, wherein depositing the base contact comprises a directional deposition process using a vacuum evaporation or a sputtering process.

6. The method of claim 1, wherein forming a base contact comprises:
    forming a highly-doped region in the base layer, the highly-doped region having an edge laterally spaced from an adjacent one of the mesa sidewalls by a distance defined by a lateral extent of overhang of the shadow metal layer;
    removing at least one of the shadow metal layer and the mask layer;
    annealing the highly-doped region; and
    forming a base contact on the highly-doped region of the base layer.

7. The method of claim 1, wherein forming a base contact comprises:
    forming a contact metal over the exposed base layer suitable for making ohmic contact to the base;
    adjusting the metal layer thickness and an implant energy of an ohmic contact enhancing dopant;
    forming a highly-doped region at the top surface in the base layer, the highly-doped region having an edge laterally spaced from an adjacent one of the mesa sidewalls by a distance defined by a lateral extent of overhang of the shadow metal layer;
    annealing the highly-doped region in the presence of the ohmic forming contact metal on the base layer.

8. A method according to claim 6 or 7 further including:
forming a wiring metal layer over the base and the emitter contact metals in electrically isolation from each other by shadowing effect of lateral overhang of the plated emitter contact metal.

9. The method of claim 8, further comprising removing the sidewall spacers before annealing the highly-doped region.

10. The method of claim 6 or 7, wherein forming the highly-doped region comprises ion implantation of dopant ions.

11. The method of claim 6, wherein the highly-doped region is annealed at about 1500° C. to about 1600° C.

12. The method of claim 7, wherein the highly-doped region is annealed at about 950° C. to about 1000° C.

13. The method of claim 1, wherein forming sidewall spacers comprises:
depositing an insulating layer on the base layer, the mask layer, and the emitter mesa; and
anisotropically etching the insulating layer, thereby forming sidewall spacers on the sidewalls of the emitter mesa.

14. The method of claim 1, wherein forming sidewall spacers comprises:
depositing a layer on the base layer, the mask layer, and the emitter mesa; and
anisotropically etching the deposited layer thereby forming sidewall spacers on the sidewalls of the emitter mesa;
forming base metal on the base layer;
removing the sidewall spacers, wherein the sidewall spacers removing is performed so as to minimize eroding the base layer metal.

15. The method of claim 13, wherein the insulating layer comprises an oxide.

16. The method of claim 1, wherein the emitter contact comprises the shadow metal layer and the mask layer.

17. The method of claim 1, wherein forming the emitter contact comprises:
removing the shadow metal layer and the mask layer to expose the emitter mesa; and
forming the emitter contact on the emitter mesa.

18. The method of claim 1, wherein forming the emitter contact comprises:
removing the shadow metal layer and a portion of the mask layer to expose a clean underlayer;
forming the emitter contact using the remaining mask layer.

19. The method of claim 1, wherein forming the emitter contact comprises:
removing the shadow metal layer and a portion of the mask layer to expose a clean underlayer;
forming the emitter contact by plating unto the remaining mask layer.

20. The method of claim 17 or 18, wherein forming the emitter contact comprises:
sequentially depositing nickel and chromium on the emitter mesa in conjunction with performing one of lift-off process or an etching process.

21. The method of claim 1, wherein the base contact is annealed in conjunction with the annealing of the emitter contact and a collector contact.

22. The method of claim 1, wherein the collector contact is formed on a collector surface on a back side of the semiconductor substrate opposite the base contact.

23. The method of claim 1, wherein forming the collector contact comprises:
etching the base layer to expose a surface of a collector layer on a front side of the semiconductor substrate laterally of the base contact; and
forming the collector contact on the exposed surface of the collector layer.

24. The method of claim 1, wherein the mask layer comprises nickel.

25. The method of claim 1, wherein the emitter mesa has a thickness of about 300 nm.

26. The method of claim 1, wherein the plated shadow metal layer comprises one of nickel, chromium and gold.

27. The method of claim 1, wherein forming the base contact comprises:
sequentially depositing titanium and aluminum onto the base layer by directional deposition process.

28. The method of claim 1, wherein forming the emitter layer comprises forming more than one emitter mesa.

29. The method of claim 1, wherein the semiconductor substrate comprises an n-type collector layer, a p-type base layer, and an n-type emitter layer epitaxially grown on an n-type substrate.

30. The method of claim 29 wherein the substrate comprises SiC.

31. The method of claim 3, wherein annealing the base, emitter, and collector contact comprises a rapid thermal anneal (RTA) process at about 900° C. to 1000° C.

32. A method of forming base contacts on a BJT, the method comprising:
epitaxially growing an n-type collector layer, a p-type base layer, and an n-type emitter layer on an n-type SiC substrate;
forming a first metal mask layer on the n-type emitter layer;
etching the n-type emitter layer to expose the p-type base layer, thereby forming an emitter mesa;
forming sidewall spacers on the sidewalls of the emitter mesa;
electroplating a second metal onto a top surface and a side surface of the first metal mask layer, thereby forming a shadow metal layer overhanging the emitter mesa; and
directionally depositing a base contact metal on the p-type base layer, using the shadow metal layer as a deposition shadow mask,
the base contact being spaced from the emitter mesa by a lateral extent of overhang of the shadow metal layer.

33. The method of claim 32, further comprising:
forming an emitter contact on the emitter mesa after forming the base metal;
forming a collector contact; and
annealing the base contact, the emitter contact, and the collector contact concurrently.

34. The method of claim 32, wherein the first metal mask layer comprises nickel.

35. The method of claim 32, wherein depositing a base contact comprises a directional deposition process.

36. A method of forming base contacts on a BJT, the method comprising:
epitaxially growing an n-type collector layer, a p-type base layer, and an n-type emitter layer on an n-type substrate;
forming a first metal mask layer on the n-type emitter layer;
etching the n-type emitter layer to expose the p-type base layer, thereby forming an emitter mesa;
forming sidewall spacers on the sidewalls of the emitter mesa;
electroplating a second metal onto a top surface and a side surface of the first metal mask layer, thereby forming a shadow metal layer overhanging the emitter mesa;
ion-implanting a highly-doped region in the base layer, using the shadow metal layer as an implantation mask, the highly-doped region being spaced from the emitter mesa by a lateral extent of overhang of the shadow metal layer;

removing the shadow mask layer and the first metal mask layer;

annealing the highly-doped region; and depositing a base contact on the highly-doped region of the p-type base layer.

37. A method of forming base contacts on a BJT, the method comprising:

epitaxially growing an n-type collector layer, a p-type base layer, and an n-type emitter layer on an n-type substrate;

forming a first metal mask layer on the n-type emitter layer;

etching the n-type emitter layer to expose the p-type base layer, thereby forming an emitter mesa;

forming sidewall spacers on the sidewalls of the emitter mesa;

electroplating a second metal onto a top surface and a side surface of the first metal mask layer, thereby forming a shadow metal layer overhanging the emitter mesa;

forming a contact metal over the exposed base layer suitable for making ohmic contact to the base;

adjusting the metal layer thickness and an implant energy of an ohmic contact enhancing dopant;

forming a highly-doped region at the top surface in the base layer, the highly-doped region having an edge laterally spaced from an adjacent one of the mesa sidewalls by a distance defined by a lateral extent of overhang of the shadow metal layer;

annealing the highly-doped region in the presence of the ohmic forming contact metal on the base.

38. The method of claim 37 further comprising:

forming a wiring metal over emitter contact metal and base contact metal by directional metal deposition using the overhang of the mushroom shape emitter contact layer to effect electrical isolation between base and emitter; and forming a collector contact.

39. The method of claim 36 or 37, further comprising:

forming an emitter contact on the emitter mesa;

forming a collector contact; and annealing the base contact, the emitter contact, and the collector contact.

40. The method of claim 36, further comprising:

forming the emitter contact on the emitter mesa by a plating process.

41. The method of claim 40, further comprising:

forming a wiring metal over emitter contact and base contact by directional metal deposition using mushroom shape emitter contact layer;

forming a collector contact.

42. The method of claim 36 or 37, wherein the first metal mask layer comprises nickel.

43. The method of claim 36, wherein depositing a base contact comprises a directional deposition process.

* * * * *